(12) United States Patent
Jin et al.

(10) Patent No.: US 10,523,184 B2
(45) Date of Patent: Dec. 31, 2019

(54) OSCILLATOR, METHOD OF OPERATING THE SAME, AND PWM CONTROLLER INCLUDING THE SAME

(71) Applicant: SEMICONDUCTOR COMPONENTS INDUSTRIES, LLC, Phoenix, AZ (US)

(72) Inventors: Wookang Jin, Bucheon (KR); Sungwon Yun, Seoul (KR); Youngmo Yang, Seoul (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 122 days.

(21) Appl. No.: 15/813,279

(22) Filed: Nov. 15, 2017

(65) Prior Publication Data

US 2019/0149137 A1 May 16, 2019

(51) Int. Cl.
| | |
|---|---|
| *H03K 3/014* | (2006.01) |
| *H02M 3/156* | (2006.01) |
| *H03K 3/0231* | (2006.01) |
| *H03K 7/08* | (2006.01) |
| *H03K 4/502* | (2006.01) |
| *H02M 1/00* | (2006.01) |

(52) U.S. Cl.
CPC ............ *H03K 3/014* (2013.01); *H02M 3/156* (2013.01); *H03K 3/0231* (2013.01); *H03K 4/502* (2013.01); *H03K 7/08* (2013.01); *H02M 2001/0032* (2013.01); *H02M 2003/1566* (2013.01)

(58) Field of Classification Search
CPC ........ H03K 3/0231; H03K 4/50; H03K 4/501; H03K 4/502; H03K 3/014; H02M 2001/0032; H02M 3/156; Y02D 10/128
See application file for complete search history.

(56) References Cited

U.S. PATENT DOCUMENTS

| | | | | |
|---|---|---|---|---|
| 4,365,212 A | * | 12/1982 | Gentile | ................ H03K 3/0231 |
| | | | | 331/111 |
| 7,298,124 B2 | * | 11/2007 | Kan | ...................... H02M 3/156 |
| | | | | 323/224 |
| 8,669,820 B2 | * | 3/2014 | Abe | ........................ H03K 4/501 |
| | | | | 327/115 |
| 9,484,893 B1 | * | 11/2016 | Ruotsalainen | ......... H03K 3/012 |

\* cited by examiner

*Primary Examiner* — Ryan Johnson
(74) *Attorney, Agent, or Firm* — AMPACC Law Group, PLLC

(57) ABSTRACT

An oscillator for a pulse width modulation (PWM) controller includes an oscillation circuit including a capacitor and configured to generate a first pulse signal by charging and discharging the capacitor, a frequency divider configured to generate a second pulse signal based on the first pulse signal, the second pulse signal having a lower frequency than the first pulse signal, and an oscillation control circuit coupled to the oscillation circuit and the frequency divider and configured to generate control signals for holding the charging and discharging of the capacitor during an oscillation holding operation.

19 Claims, 5 Drawing Sheets

OSCILLATOR, METHOD OF OPERATING THE SAME, AND PWM CONTROLLER INCLUDING THE SAME

FIELD OF THE DISCLOSURE

The present disclosure relates to an oscillator, and more particularly, to an oscillator for performing an oscillation holding operation, an oscillation holding method of the oscillator, and a PWM controller including the oscillator.

BACKGROUND

Integrated circuit (IC) devices, such as a power converter, a power supplier, and so on, use a pulse width modulation (PWM) controller. The pulse width modulation (PWM) controller includes an oscillator to secure a pulse signal having a variable frequency. For example, in a PWM controller utilizing a boundary conduction mode (BCM) control algorithm, it is important to prevent the PWM controller from entering a continuous conduction mode (CCM). To prevent the mode change of the PWM controller from a BCM to the CCM, the PWM controller includes an oscillator that performs an oscillation holding operation when the BCM of the PWM controller ends.

BRIEF DESCRIPTION OF THE DRAWINGS

In the accompanying figures like reference numerals refer to identical or functionally similar elements throughout the separate views, together with the detailed description below, and are incorporated in and form part of the specification to further illustrate embodiments of concepts that include the claimed invention and explain various principles and advantages of those embodiments.

DETAILED DESCRIPTION

Figure 1:
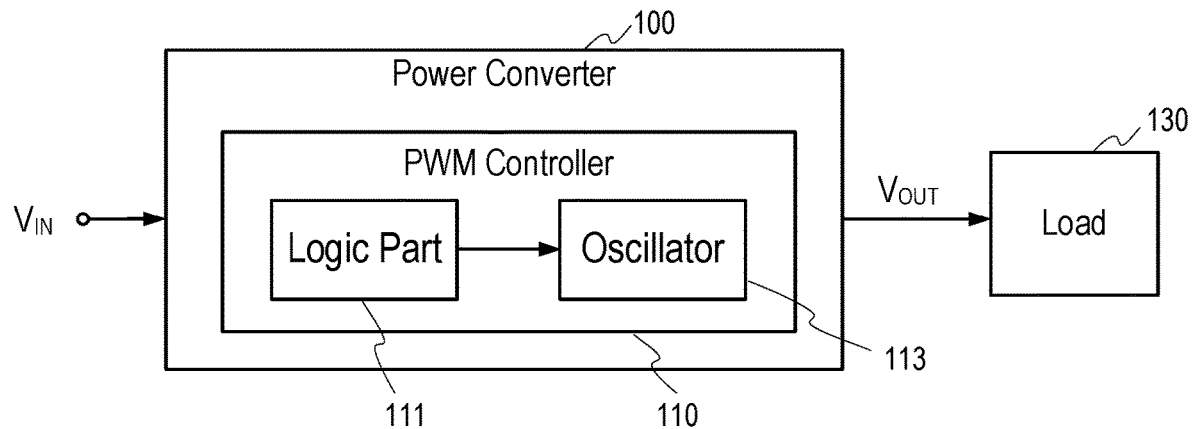
FIG. 1 illustrates an integrated circuit device including an oscillator according to an embodiment.

Embodiments relate to an oscillator for performing an oscillation holding operation, a PWM controller including the oscillator, and an oscillation holding method of the oscillator.

In the following detailed description, certain illustrative embodiments have been illustrated and described. As those skilled in the art would realize, these embodiments may be modified in various different ways without departing from the scope of the present disclosure. Accordingly, the drawings and description are to be regarded as illustrative in nature and not restrictive. Like reference numerals designate like elements in the specification.

In an embodiment, an oscillator includes an oscillation circuit including a capacitor and configured to generate a first pulse signal by charging and discharging the capacitor, a frequency divider configured to generate a second pulse signal based on the first pulse signal, the second pulse signal having a lower frequency than the first pulse signal, and an oscillation control circuit coupled to the oscillation circuit and the frequency divider and configured to generate control signals for holding the charging and discharging of the capacitor during an oscillation holding operation. The oscillator is provided as part of a pulse width modulation (PWM) controller.

In an embodiment, the oscillation circuit uses a saw-tooth oscillator. The PWM controller utilizes a boundary conduction mode (BCM) control algorithm, and the oscillation control circuit generates the control signals based on the first pulse signal, a BCM end detection signal, and a pulse detection signal.

In an embodiment, the oscillation holding operation is activated when the BCM end detection signal and the pulse detection signal are enabled, and deactivated when the BCM end detection signal is disabled. The pulse detection signal is generated by the frequency divider by detecting an (N−j)th cycle of the first pulse signal among N cycles of the first pulse signal that correspond to one cycle of the second pulse signal, wherein N and j are positive integers, the N being greater than j.

FIG. 1 illustrates an integrated circuit device 100 according to an embodiment. The integrate circuit 100 may include any of a power converter, a power supplier, and so on.

The integrated circuit device 100, e.g., a power converter, receives an input voltage Vin and provides an output voltage $V_{OUT}$ to a load 130. The power converter 100 includes a PWM controller 110.

The PWM controller 110 of FIG. 1 is designed for power-supply control. The PWM controller 110 according to this embodiment utilizes a boundary conduction mode (BCM) control algorithm, and includes a logic part 111 and an oscillator 113.

The oscillator 113 of FIG. 1 may generate a pulse signal having an oscillation frequency, which varies in a target frequency range, and provide the oscillation frequency of the pulse signal as a variable frequency used for the power-supply control of the PWM controller 110. For example, the variable frequency is used to turn on a switching device (not shown) of the PWM controller 110 that provides current to an energy storage device (e.g., an inductor or transformer) of the power converter 100. The oscillator 113 used in the PWM controller 110 may include a saw-tooth oscillator.

In an embodiment, the oscillator 113 of FIG. 1 performs an oscillation holding operation in response to a first mode end detection signal from the logic part 111 to prevent a mode of the PWM controller 110 from being changed from a first mode to a second mode. In an embodiment, the first mode is a BCM, and the second mode is a continuous conduction mode (CCM).

The CCM and the BCM relate to operational cycles of the power converter 100 in which the energy storage device, such as an inductor, is charged and discharged. The CCM and the BCM may be distinguished in that, in the CCM, a current of the energy storage device never drops to zero during the operational cycles, while, in the BCM, the current drops to zero at the end of a discharge period of each operational cycle, and then resumes when the charging period of the subsequent operational cycle begins.

The load 130 of FIG. 1 may include one or more integrated chips (ICs). In an embodiment, the output voltage $V_{OUT}$ is used to supply power to a Central Processing Unit (CPU), a Graphics Processing Unit (GPU), an integrated memory circuit, a battery charger, a light emitting diode (LED), or other types of electrical load.

Figure 2:
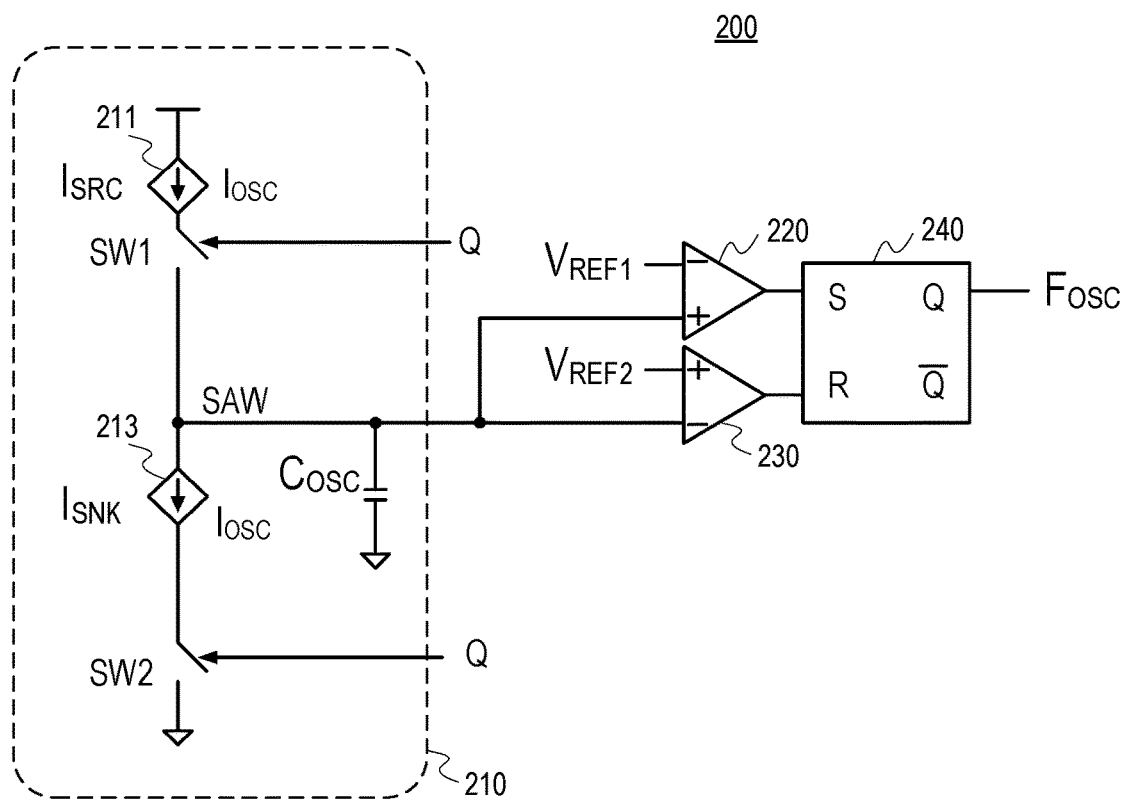
FIG. 2 illustrates a typical saw-tooth oscillator.

FIG. 2 illustrates a saw-tooth oscillator 200 that is an example of an oscillator used in a PWM controller. The saw-tooth oscillator 200 includes a triangular pulse generating circuit 210, first and second comparators 220 and 230, and an RS flip-flop 240.

The triangular pulse generating circuit 210 of FIG. 2 includes a sourcing current source 211, a sinking current source 213, first and second switches SW1 and SW2, and a capacitor $C_{OSC}$. The capacitor $C_{OSC}$ has a first end commonly coupled to the first comparator 220, the second comparator 230, and a common node of the first and second switches SW1 and SW2, and has a second end coupled to a ground voltage terminal.

The sourcing current source 211 supplies a sourcing current $I_{SRC}$ to the common node of the first and second switches SW1 and SW2 when the first switch SW1 is turned on. The sinking current source 213 sinks a sinking current $I_{SNK}$ from the common node of the first and second switches SW1 and SW2 when the second switch SW2 is turned on.

The first comparator 220 of FIG. 2 receives a triangular pulse signal SAW of the capacitor $C_{OSC}$ at its positive input terminal (+), which is coupled to the first end of the capacitor $C_{OSC}$, and receives a first reference voltage $V_{REF1}$ at its negative input terminal (−). The second comparator 230 of FIG. 2 receives a second reference voltage $V_{REF2}$ at its positive terminal (+), and receives the triangular pulse signal SAW at its negative terminal (−), which is coupled to the first end of the capacitor $C_{OSC}$. The first and second reference voltages $V_{REF1}$ and $V_{REF2}$ determine a swing width of the triangular pulse signal SAW. That is, the first reference voltage $V_{REF1}$ determines a high voltage level of the triangular pulse signal SAW, and the second reference voltage $V_{REF2}$ determines a low voltage level of the triangular pulse signal SAW.

The RS flip-flop 240 of FIG. 2 receives an output signal of the first comparator 220 at a set (S) input terminal, and receives an output signal of the second comparator 230 at a reset (R) input terminal. The RS flip-flop 240 outputs a pulse signal $F_{OSC}$ having a rectangular shape through a first output terminal Q, and outputs an inverted signal/$F_{OSC}$ of the pulse signal $F_{OSC}$ that has an opposite phase to the pulse signal $F_{OSC}$ through a second output terminal /Q.

In the triangular pulse generating circuit 210 of FIG. 2 that includes the first and second switches SW1 and SW2, both of the first and second switches SW1 and SW2 operate in response to the pulse signal $F_{OSC}$ output through the first output terminal Q of the RS flip-flop 240. In an example, the first and second switches SW1 and SW2 may include a PMOS transistor and an NMOS transistor, respectively, and thus both of the PMOS transistor and the NMOS transistor may be selectively activated or deactivated depending on the pulse signal $F_{OSC}$ received through gate terminals thereof.

In other examples, the first and second switches SW1 and SW2 of FIG. 2 may include any other switching elements. For example, both of the first and second switches SW1 and SW2 may include NMOS transistors. In this case, the first and second switches SW1 and SW2 are selectively activated or deactivated depending on the inverted pulse signal /$F_{OSC}$ and the pulse signal $F_{OSC}$ received through gate terminals thereof, respectively.

In an illustrative embodiment of the oscillator 200 of FIG. 2, the first and second switches SW1 and SW2 include a PMOS transistor and an NMOS transistor, respectively. Therefore, when the pulse signal $F_{OSC}$ has a low level, the first switch SW1 is turned on and the second switch SW2 is turned off. At this time, the capacitor $C_{OSC}$ is charged by the sourcing current $I_{SRC}$ as the sourcing current $I_{SRC}$ flows to the capacitor $C_{OSC}$ through the first switch SW1 that is turned on. If a voltage level of the triangular pulse signal SAW becomes higher than the first reference voltage $V_{REF1}$ as a result of the charge operation, the output signal of the first comparator 220 has a high level, and thus the RS flip-flop 240 is set, such that the pulse signal $F_{OSC}$ changes to a high level.

On the other hand, when the pulse signal $F_{OSC}$ has a high level, the first switch SW1 is turned off and the second switch SW2 is turned on. At this time, the capacitor $C_{OSC}$ is discharged by the sinking current $I_{SNK}$ as the sinking current $I_{SNK}$ flows to the ground voltage terminal through the second switch SW2 that is turned on. If the voltage level of the triangular pulse signal SAW becomes less than the second reference voltage $V_{REF2}$ as a result of the discharge operation, the output signal of the second comparator 230 has a high level, and thus the RS flip-flop 240 is reset, such that the pulse signal $F_{OSC}$ changes to a low level.

When the pulse signal $F_{OSC}$ changes to the low level, the above-mentioned charge operation is performed again. These repeating charge and discharge operations result in an oscillation, and generate the pulse signal $F_{OSC}$ having an oscillation frequency f that varies in a target frequency range.

Provided that the sourcing current $I_{SRC}$ and the sinking current $I_{SNK}$ are substantially constant and substantially the same as an oscillation current $I_{OSC}$ for generating the oscillation frequency f, i.e., $I_{SRC}=I_{SNK}=I_{OSC}$, an oscillation period T can be represented by Equation 1 below, and the oscillation frequency f of the pulse signal $F_{OSC}$ can be represented by Equation 2 below:

$$T=(2*C_{OSC}*(V_{REF1}-V_{REF2}))/I_{OSC} \qquad \text{Equation 1,}$$

and $$f=I_{OSC}/(2*C_{OSC}*(V_{REF1}-V_{REF2})) \qquad \text{Equation 2,}$$

wherein $C_{OSC}$ is indicative of a capacitance of the capacitor $C_{OSC}$, $V_{REF1}$ corresponds to a high voltage level of the triangular pulse signal SAW, and $V_{REF2}$ corresponds to a low voltage level of the triangular pulse signal SAW. Thus, the triangular pulse signal SAW swings between the first reference voltage $V_{REF1}$ and the second reference voltage $V_{REF2}$.

As shown in Equation 2, a frequency range of the oscillation frequency f may change by adjusting a level of the oscillation current $I_{OSC}$ ($=I_{SRC}=I_{SNK}$), which flows through the first or second switch SW1 or SW2, and the capacitance of the capacitor $C_{OSC}$ when the first and second reference voltages $V_{REF1}$ and $V_{REF2}$ are predetermined and fixed.

In some cases, a target frequency range of an oscillation frequency required for an operation of a PWM controller may be set to have a range of 800 Hz to 100 kHz, and, more specifically, a range of 800 Hz to 65 kHz.

In order to set the target frequency range to have a very low frequency, e.g., 800 Hz, as a minimum frequency, it is required to decrease a level of the oscillation current $I_{OSC}$ of the oscillator 200 or increase the capacitance of the capacitor $C_{OSC}$ included in the oscillator 200, as can be seen from Equation 2.

For example, when the capacitor $C_{OSC}$ has the capacitance of 10 pF, the oscillation current $I_{OSC}$ of the oscillator 200 should have about 40 nA in order to secure the minimum frequency of 800 Hz.

However, since the level, 40 nA, of the oscillation current $I_{OSC}$ is very small and similar to a leakage current, the level of the oscillation current $I_{OSC}$ can be easily influenced by a noise, and thus it is difficult to accurately control the minimum frequency by adjusting the level of the oscillation current $I_{OSC}$. Therefore, there is a limit in controlling the minimum frequency by adjusting the level of the oscillation current $I_{OSC}$ when the capacitance of the capacitor $C_{OSC}$ is fixed to 10 pF.

Alternatively, instead of adjusting the level of the oscillation current $I_{OSC}$, the capacitance of the capacitor $C_{OSC}$ of the oscillator 200 can be adjusted to accurately control the minimum frequency. However, when increasing the capacitance of the capacitor $C_{OSC}$ in order to obtain the minimum frequency of 800 Hz, a size of the oscillator 200 is significantly increased because of the size of the capacitor $C_{OSC}$.

Therefore, to overcome the drawbacks and accurately control or trim minimum and maximum frequencies of a target frequency range, the present disclosure provides an oscillator using sourcing and sinking currents, each of which has a reasonable level, e.g., N times larger than the level of the oscillation current $I_{OSC}$ used in the oscillator 200 of FIG. 2, thereby easily controlling or trimming the target frequency range, specially, the minimum frequency, N being a positive integer.

However, since, when the sourcing and sinking currents are increased to have the level that is N times larger than the level of the oscillation current $I_{OSC}$, minimum and maximum frequencies of the pulse signal $F_{OSC}$ output from the oscillator 200 of FIG. 2 are also increased N times, an oscillator according to an embodiment of the present disclosure may use sourcing and sinking currents each having a level that is N times larger than the level of the oscillation current $I_{OSC}$ for generating the oscillation frequency f and also employ a 1/N frequency divider to make an oscillation frequency of the oscillator varying in the target frequency range.

Figure 3:
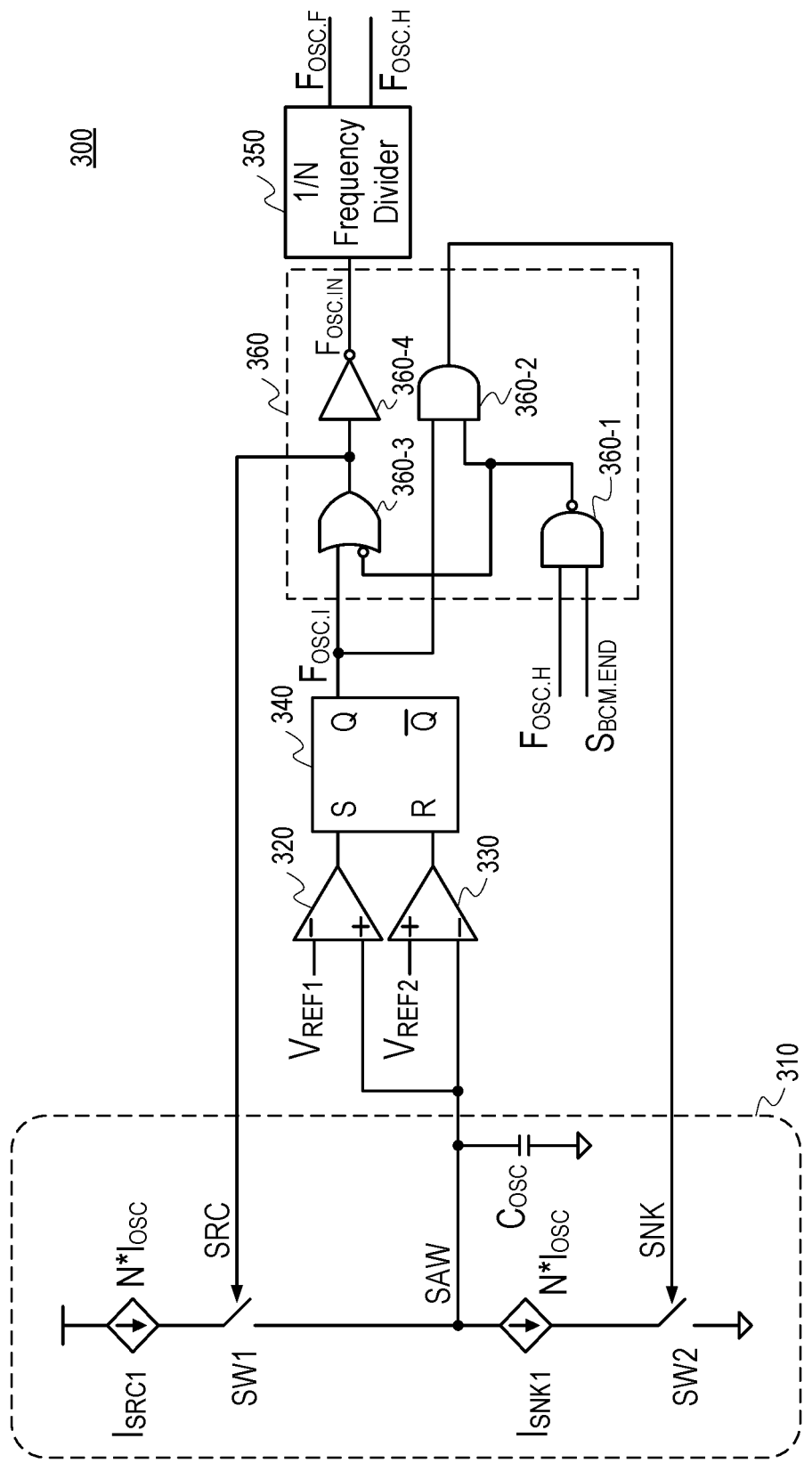
FIG. 3 illustrates an oscillator according to an embodiment.

FIG. 3 illustrates an oscillator 300 according to an embodiment. The oscillator 300 may be employed in a PWM controller that utilizes a BCM control algorithm, and may have a target frequency range of, e.g., 800 Hz to 100 kHz or 800 Hz to 65 kHz.

The oscillator 300 of FIG. 3 is provided with sourcing and sinking currents, each of which has a current level that is N times larger than the level of the oscillation current $I_{OSC}$ used in the oscillator 200 of FIG. 2, and generates an output pulse signal $F_{OSC.F}$ having an oscillation frequency varying in the target frequency range.

Referring to FIG. 3, the oscillator 300 includes a triangular pulse generating circuit 310, first and second comparators 320 and 330, an RS flip-flop 340, a 1/N frequency divider 350, and an oscillation control circuit 360. The triangular pulse generating circuit 310, the first and second comparators 320 and 330, and the RS flip-flop 340 have substantially the same configurations as the triangular pulse generating circuit 210, the first and second comparators 220 and 230, and the RS flip-flop 240 illustrated in FIG. 2, respectively. Therefore, for the simplicity of explanation, the detailed description thereof will be omitted.

In this embodiment, a sourcing current $I_{SRC1}$ and a sinking current $I_{SNK1}$ are supplied to the triangular pulse generating circuit 310 of FIG. 3 to perform charging and discharging operations of a capacitor $C_{OSC}$. Each of the sourcing current $I_{SRC1}$ and the sinking current $I_{SNK1}$ has a current level that is N times larger than the level of the oscillation current $I_{OSC}$ that is used in the oscillator 200 of FIG. 2 to accurately control a minimum frequency of the target frequency range. That is, in this embodiment, $I_{SRC1}=I_{SNK}1=N*I_{OSC}$, N being a positive integer. By increasing the levels of the sourcing current $I_{SRC1}$ and the sinking current $I_{SNK1}$, it is much easier to adjust minimum levels of the sourcing current $I_{SRC1}$ and the sinking current $I_{SNK1}$ without being affected by a noise, and thus it is possible to precisely adjust the minimum frequency of the target frequency range.

As the sourcing current $I_{SRC1}$ and the sinking current $I_{SNK1}$, each having the current level of $N*I_{OSC}$, are applied to the triangular pulse generating circuit 310 of FIG. 3, a speed of the charging and discharging operations of the capacitor $C_{OSC}$ becomes N times faster than the charging and discharging operations of the oscillator 200 of FIG. 2. As a result, the RS flip-flop 340 of FIG. 3 outputs an internal pulse signal (or first pulse signal) $F_{OSC.I}$ having an oscillation frequency that is N times higher than the oscillation frequency of the pulse signal $F_{OSC}$ of the oscillator 200 shown in FIG. 2 in which the oscillation current $I_{OSC}$ is used as the sourcing current $I_{SRC}$ and the sinking current $I_{SNK}$. That is, the oscillation frequency of the internal pulse signal $F_{OSC.I}$ corresponds to a charging or discharging speed of the capacitor $C_{OSC}$.

In this embodiment, in order to output the output pulse signal (or second pulse signal) $F_{OSC.F}$ that has the oscillation frequency varying in the target frequency range, the 1/N frequency divider 350 of FIG. 3 is added to be coupled to an output terminal of the RS flip-flop 340. The 1/N frequency divider 350 lowers the oscillation frequency of the internal pulse signal $F_{OSC.I}$, which is output from the RS flip-flop 340, by 1/N times and outputs the frequency lowered pulse signal as the output pulse signal $F_{OSC.F}$.

For example, assuming that the target frequency range of the oscillator 300 of FIG. 3 is 800 Hz to 65 kHz and N is 10, the sourcing current $I_{SRC1}$ and the sinking current $I_{SNK1}$, each having a current level that is 10 times larger than the level of the oscillation current $I_{OSC}$, i.e., $I_{SRC1}=I_{SNK}1=10*I_{OSC}$, are applied to the triangular pulse generating circuit 310 of FIG. 3, the charging and discharging operations of the capacitor $C_{OSC}$ are performed 10 times faster than those operations of the oscillator 200 of FIG. 2. Therefore, the internal pulse signal $F_{OSC.I}$ output from the RS flip-flop 340 of FIG. 3 has an oscillation frequency varying in a range of 8 kHz to 650 kHz, which corresponds to the sourcing current $I_{SRC1}$ and the sinking current $I_{SNK1}$, each having the current level of $10*I_{OSC}$. After that, a 1/10 frequency divider, which is used as the 1/N frequency divider 350, lowers the oscillation frequency of the internal pulse signal $F_{OSC.I}$ by 1/10 times. As a result, the output pulse signal $F_{OSC.F}$ varying in the target frequency range of 800 Hz to 65 kHz is output from the 1/10 frequency divider of the oscillator 300.

In addition, since the oscillator 300 of FIG. 3 may be employed in the PWM controller that utilizes the BCM control algorithm, the oscillator 300 further includes the oscillation control circuit 360 for controlling an oscillation holding operation by detecting the ending of a BCM of the PWM controller. The oscillation holding operation is performed to prevent an operation mode of the PWM controller from being changed from the BCM to a CCM. In this embodiment, to perform the oscillation holding operation, the oscillation control circuit 360 is disposed between the RS flip-flop 340 and the 1/N frequency divider 350 of FIG. 3.

The oscillator 300 of FIG. 3 may perform the oscillation holding operation based on a BCM end detection signal $S_{BCM.END}$ and an (N–j)th pulse detection signal $F_{OSC.H}$ output from the 1/N frequency divider 350, j being a positive integer smaller than N. The BCM end detection signal $S_{BCM.END}$ is provided by a logic part (e.g., logic part 111 in FIG. 1) of the PWM controller.

In an embodiment, the BCM end detection signal $S_{BCM.END}$ may be enabled when an output voltage $V_{OUT}$ of an integrated circuit device, e.g., the power converter 100 shown in FIG. 1, is turned on, and disabled when a storage energy of a load, e.g., the load 130 shown in FIG. 1, is zero.

In an embodiment, the BCM end detection signal $S_{BCM\_END}$ is enabled to a high level after the output pulse signal $F_{OSC\_F}$ transitions to the high level. The oscillation holding operation is activated when the BCM end detection signal $S_{BCM\_END}$ is enabled to the high level and the (N−j)th pulse detection signal $F_{OSC\_H}$ output from the 1/N frequency divider 350 is enabled to a high level. The oscillation holding operation is deactivated when the BCM end detection signal $S_{BCM\_END}$ is disabled to a low level.

The 1/N frequency divider 350 counts cycles of the internal pulse signal $F_{OSC\_I}$ after the output pulse signal $F_{OSC\_F}$ transitions to the high level and generates the (N−j)th pulse detection signal $F_{OSC\_H}$ by detecting an (N−j)th cycle of the internal pulse signal $F_{OSC\_I}$ when N cycles of the internal pulse signal $F_{OSC\_I}$ is converted to one cycle of the output pulse signal $F_{OSC\_F}$ by the 1/N frequency divider 350.

The (N−j)th pulse detection signal $F_{OSC\_H}$ may be enabled at a rising edge or a falling edge of the (N−j)th cycle of the inter pulse signal $F_{OSC\_I}$. The (N−j)th pulse detection signal $F_{OSC\_H}$ may maintain the enabled high level for a half cycle of the internal pulse signal $F_{OSC\_I}$ after it is enabled, or may be disabled when the output pulse signal $F_{OSC\_F}$ transitions to the high level.

Referring to FIG. 3, when the oscillation holding operation is activated, i.e., when both of the BCM end detection signal $S_{BCM\_END}$ and the (N−j)th cycle of the internal pulse signal $F_{OSC\_I}$ are enabled to the high level, the oscillation control circuit 360 generates first and second switch control signals SRC and SNK that turn off first and second switches SW1 and SW2 of the triangular pulse generating circuit 310, such that the oscillator 300 holds an oscillation operation. The oscillation operation is held until the oscillation holding operation is deactivated in response to the BCM end detection signal $S_{BCM\_END}$ that is disabled to the low level. While the oscillation holding operation is activated, the internal pulse signal $F_{OSC\_I}$ and the output pulse signal $F_{OSC\_F}$ may maintain their previous levels.

Referring to FIG. 3, the oscillation control circuit 360 includes a NAND gate 360-1, an AND gate 360-2, an OR gate 360-3, and an inverter 360-4. The NAND gate 360-1 receives the BCM end detection signal $S_{BCM\_END}$ and the (N−j)th pulse detection signal $F_{OSC\_H}$. The AND gate 360-2 receives an output signal of the NAND gate 360-1 and the internal pulse signal $F_{OSC\_I}$, and generates the second switch control signal SNK. The OR gate 360-3 receives the internal pulse signal $F_{OSC\_I}$ and an inverted signal of the output signal of the NAND gate 360-1, and generates the first switch control signal SRC. The inverter 360-4 inverts an output signal of the OR gate 360-3, and outputs the inverted signal, as an intermediate pulse signal $F_{OSC\_IN}$, to the 1/N frequency divider 350. The detailed operation of the oscillation control circuit 360 will be described later.

In another embodiment, the oscillation control circuit 360 of FIG. 3 may be implemented with a state machine. The state machine receives the BCM end detection signal $S_{BCM\_END}$, the (N−j)th pulse detection signal $F_{OSC\_H}$, and the internal pulse signal $F_{OSC\_I}$ as input signals, and generates the first and second switch control signals SRC and SNK for controlling the oscillation holding operation and the intermediate pulse signal $F_{OSC\_IN}$ based on the input signals.

The 1/N frequency divider 350 of FIG. 3 receives the intermediate pulse signal $F_{OSC\_IN}$ output from the oscillation control circuit 360 and generates the output pulse signal $F_{OSC\_F}$ and the (N−j)th pulse detection signal $F_{OSC\_H}$. The (N−j)th pulse detection signal $F_{OSC\_H}$ is supplied to the oscillation control circuit 360 to activate the oscillation holding operation when the BCM end detection signal $S_{BCM\_END}$ is enabled.

In an embodiment, an (N−1)th pulse detection signal is used as the pulse signal $F_{OSC\_H}$ for controlling the oscillation holding operation. In another embodiment, a pulse signal generated earlier than the (N−1)th pulse detection signal, e.g., an (N−2)th pulse detection signal, may be used to activate the oscillation holding operation.

N is determined by the minimum frequency of the target frequency range. N has a bigger value as the minimum frequency has a lower value. In some embodiments, N may be equal to or larger than 8, and may be in a range of 8 and 20.

Figure 4:
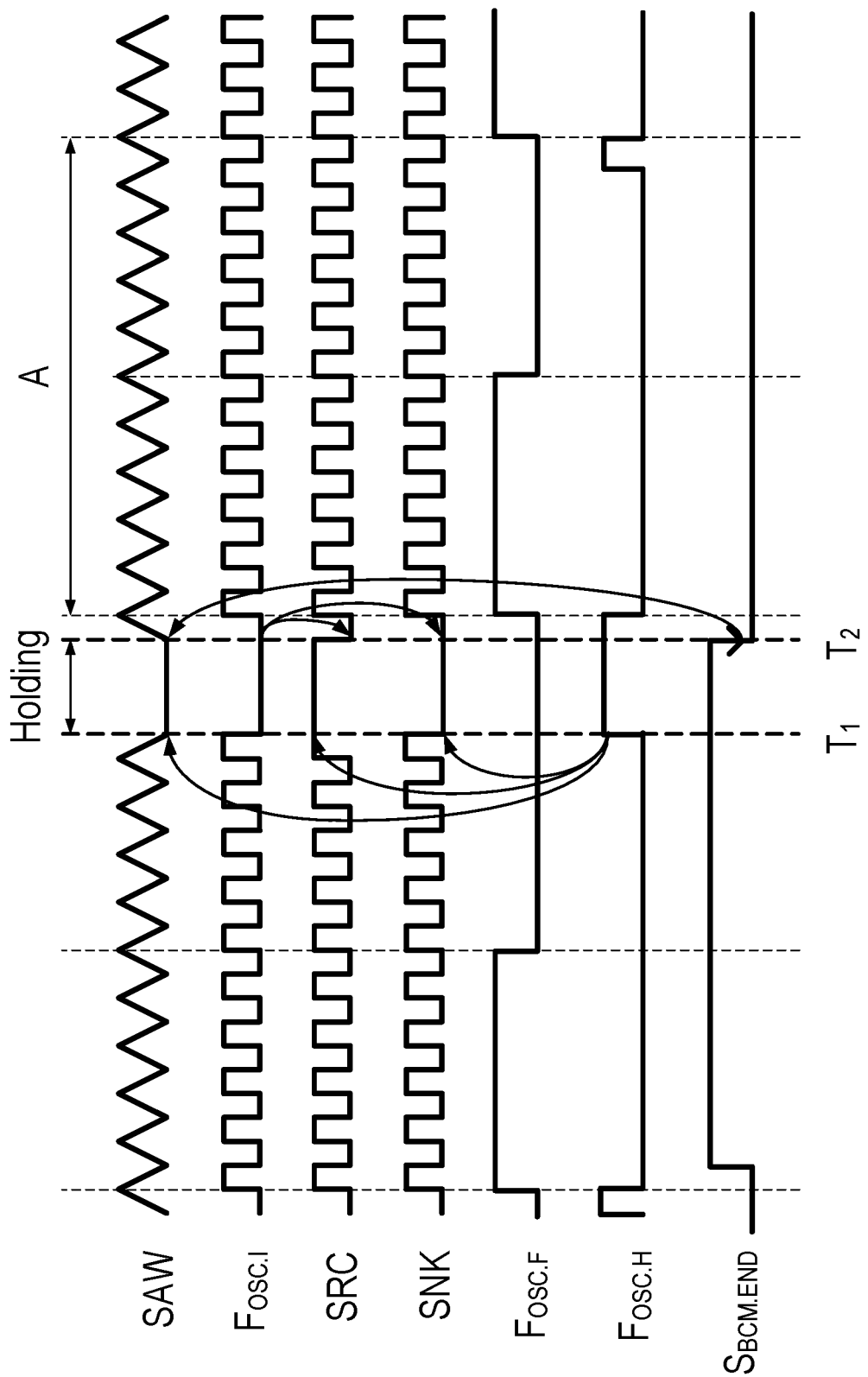
FIG. 4 is a timing diagram illustrating an operation of the oscillator of FIG. 3 according to an embodiment.

FIG. 4 illustrates a timing diagram of an oscillation holding operation of the oscillator of FIG. 3 according to an embodiment. The oscillation holding operation will be described with reference to FIGS. 3 and 4.

In the embodiment shown in FIG. 4, N is set to 10. The (N−j)th pulse detection signal $F_{OSC\_H}$ is enabled at a falling edge of a 9th cycle of the inter pulse signal $F_{OSC\_I}$. According to this embodiment, the oscillator 300 of FIG. 3 performs the charging and discharging operation of the capacitor $C_{OSC}$ using the sourcing and sinking currents $I_{SRC1}$ and $I_{SNK1}$ each having a current level corresponding to $10*I_{OSC}$, and that the oscillator 300 includes a 1/10 frequency divider as the 1/N frequency divider 350.

Referring to FIGS. 3 and 4, during a period of time, e.g., 'A,' the oscillator 300 performs a normal oscillation operation. When the oscillator 300 performs the normal oscillation operation, the BCM end detection signal $S_{BCM\_END}$ has a disabled state, e.g., a low level. Since the BCM end detection signal $S_{BCM\_END}$ has the low level, the output signal of the NAND gate 360-1 has a high level regardless of a logic level of the (N−j)th pulse detection signal $F_{OSC\_H}$, and thus the oscillation control circuit 360 generates the first and second switch control signals SRC and SNK based on the internal pulse signal $F_{OSC\_I}$.

The triangular pulse generating circuit 310, the first and second comparators 320 and 330, and the RS flip-flop 340 of FIG. 3 performs an oscillation operation in response to the first and second switch control signals SRC and SNK that are generated based on the internal pulse signal $F_{OSC\_I}$. In particular, as described above with reference to FIG. 2, in an embodiment in which the first and second switches SW1 and SW2 of the triangular pulse generating circuit 310 include a PMOS transistor and an NMOS transistor, respectively, when the internal pulse signal $F_{OSC\_I}$ output from the RS flip-flop 340 has a low level, the first switch SW1 is turned on and the second switch SW2 is turned off in response to the first and second switch control signals SRC and SNK, respectively, which have the same logic level as the internal pulse signal $F_{OSC\_I}$, i.e., the low level. At this time, the capacitor $C_{OSC}$ is charged by the sourcing current $I_{SRC1}$ as the sourcing current $I_{SRC1}$ flows to the capacitor $C_{OSC}$ through the first switch SW1 that is turned on. If a voltage level of the triangular pulse signal SAW becomes higher than the first reference voltage $V_{REF1}$ as a result of the charge operation, the output signal of the first comparator 320 has a high level, and thus the RS flip-flop 340 is set, such that the internal pulse signal $F_{OSC\_I}$ changes to a high level.

On the other hand, when the internal pulse signal $F_{OSC\_I}$ has the high level, the first switch SW1 is turned off and the second switch SW2 is turned on in response to the first and second switch control signals SRC and SNK, respectively, which have the same logic level as the internal pulse signal $F_{OSC.I}$, i.e., the high level. At this time, the capacitor $C_{OSC}$ is discharged by the sinking current $I_{SNK1}$ as the sinking current $I_{SNK1}$ flows to the ground voltage terminal through the second switch SW2. If the voltage level of the triangular pulse signal SAW becomes less than the second reference voltage $V_{REF2}$ as a result of the discharge operation, the output signal of the second comparator 330 has a high level, and thus the RS flip-flop 340 is reset, such that the internal pulse signal $F_{OSC.I}$ changes to the low level.

When the internal pulse signal $F_{OSC.I}$ changes to the low level, the above-mentioned charge operation is performed again. These repeating charge and discharge operations result in an oscillation, and generate the internal pulse signal $F_{OSC.I}$ having an oscillation frequency that corresponds to the current levels of the sourcing current $I_{SRC1}$ and sinking current $I_{SNK1}$.

As the first and second switches SW1 and SW2 normally operate in response to the first and second control signals SRC and SNK, respectively, the oscillator 300 of FIG. 3 generates the internal pulse signal $F_{OSC.I}$ having a frequency that is 10 times higher than the oscillation frequency of the pulse signal $F_{OSC}$ of the oscillator 200 when N is set to 10, and generates, using the 1/10 frequency divider, the output pulse signal $F_{OSC.F}$ having a frequency that is 1/10 times lower than the frequency of the internal pulse signal $F_{OSC.I}$, so that output pulse signal $F_{OSC.F}$ varies in the target frequency range.

Meanwhile, if the BCM of the PWM controller ends and thus the BCM end detection signal $S_{BCM.END}$ is enabled to the high level, the output signal of the NAND gate 360-1 of FIG. 3 is determined depending on the (N−j)th pulse detection signal $F_{OSC.H}$. Therefore, when the (N−j)th pulse detection signal $F_{OSC.H}$ also changes to the high level at a point of time $T_1$ as shown in FIG. 4, the NAND gate 360-1 generates an output signal having a low level. As a result, in response to the output signal of the NAND gate 360-1 having the low level, the AND gate 360-2 of FIG. 3 generates the second switch control signal SNK that is set to a low level, and the OR gate 360-3 of FIG. 3 generates the first switch control signal SRC that is set to a high level.

In response to the first and second switch control signal SRC and SNK that are set to the high level and the low level, respectively, both of the first and second switches SW1 and SW2 in the triangular pulse generating circuit 310 of FIG. 3 are turned off, and thus both of the charging and discharging operations of the capacitor $C_{OSC}$ are deactivated. As the charging and discharging operations of the capacitor $C_{OSC}$ are deactivated, the oscillation operation is held, i.e., the oscillation holding operation is activated.

While the oscillation holding operation is activated, the internal pulse signal $F_{OSC.I}$ and the output pulse signal $F_{OSC.F}$ maintain their previous logic levels, i.e., a low level in FIG. 4. The (N−j)th pulse detection signal $F_{OSC.H}$, also maintains its previous logic level, i.e., the high level.

After the oscillation holding operation is performed, when the BCM end detection signal $S_{BCM.END}$ is disabled to the low level, the PWM controller is not in the CCM but in the BCM and then the oscillation holding operation stops.

In particular, if the BCM end detection signal $S_{BCM.END}$ is disabled to the low level at a point of time $T_2$ as shown in FIG. 4, the output signal of the NAND gate 360-1 of FIG. 3 changes to the high level, and thus the first and second switch control signals SRC and SNK are determined by a logic level of the internal pulse signal $F_{OSC.I}$. Therefore, as shown in FIG. 4, when the BCM end detection signal $S_{BCM.END}$ is disabled to the low level, the first switch control signal SRC changes to the low level in response to the internal pulse signal $F_{OSC.I}$ that has the low level at that time. The second switch control signal SNK maintains the low level in response to the internal pulse signal $F_{OSC.I}$ having the low level.

As the first switch control signal SRC changes to the low level and the second switch control signal SNK maintains the low level, the first and second switches SW1 and SW2 of FIG. 3 are turned on and turned off, respectively, such that the charging operation of the capacitor $C_{OSC}$ of FIG. 3 is performed. Accordingly, the RS flip-flop 340 of FIG. 3 is set, and thus the internal pulse signal $F_{OSC.I}$ changes to the high level. As a result, the oscillator 300 of FIG. 3 resumes the oscillation operation, and the internal pulse signal $F_{OSC.I}$ and the output pulse signal $F_{OSC.F}$ are normally generated as shown in the 'A' period of FIG. 4.

When the oscillation holding operation is deactivated, one of the first and second switch control signals SRC and SNK is enabled depending on the previous logic level of the internal pulse signal $F_{OSC.I}$.

As described above, in a certain time after the oscillation holding operation is performed, the PWM controller returns to the BCM. If the PWM controller returns to the BCM without entering the CCM, the BCM end detection signal $S_{BCM.END}$ is disabled to the low level.

When the BCM end detection signal $S_{BCM.END}$ is disabled to the low level before the (N−j)th pulse detection signal $F_{OSC.H}$ is generated in one cycle of the output pulse signal $F_{OSC.F}$, the oscillator 300 can continuously perform the oscillation operation without holding the oscillation operation. Therefore, to avoid the unnecessary oscillation holding, it is advantageous to determine the oscillation holding activation time to be closer to the end of one cycle of the output pulse signal $F_{OSC.F}$ by using the (N−j)th pulse detection signal $F_{OSC.H}$ generated from the 1/N frequency divider 350.

In some embodiments, j becomes larger as N increases. In the embodiment shown in FIG. 4, j is 1 when N is 10, and a signal detecting the 9th cycle of the internal pulse signal $F_{OSC.I}$ is used as the (N−j)th pulse detection signal $F_{OSC.H}$ determining the oscillation holding activation time, but embodiments are not limited thereto. In another embodiment, a signal detecting an 8th cycle of the internal pulse signal $F_{OSC.I}$ can be used as the (N−j)th pulse detection signal $F_{OSC.H}$.

Figure 5:
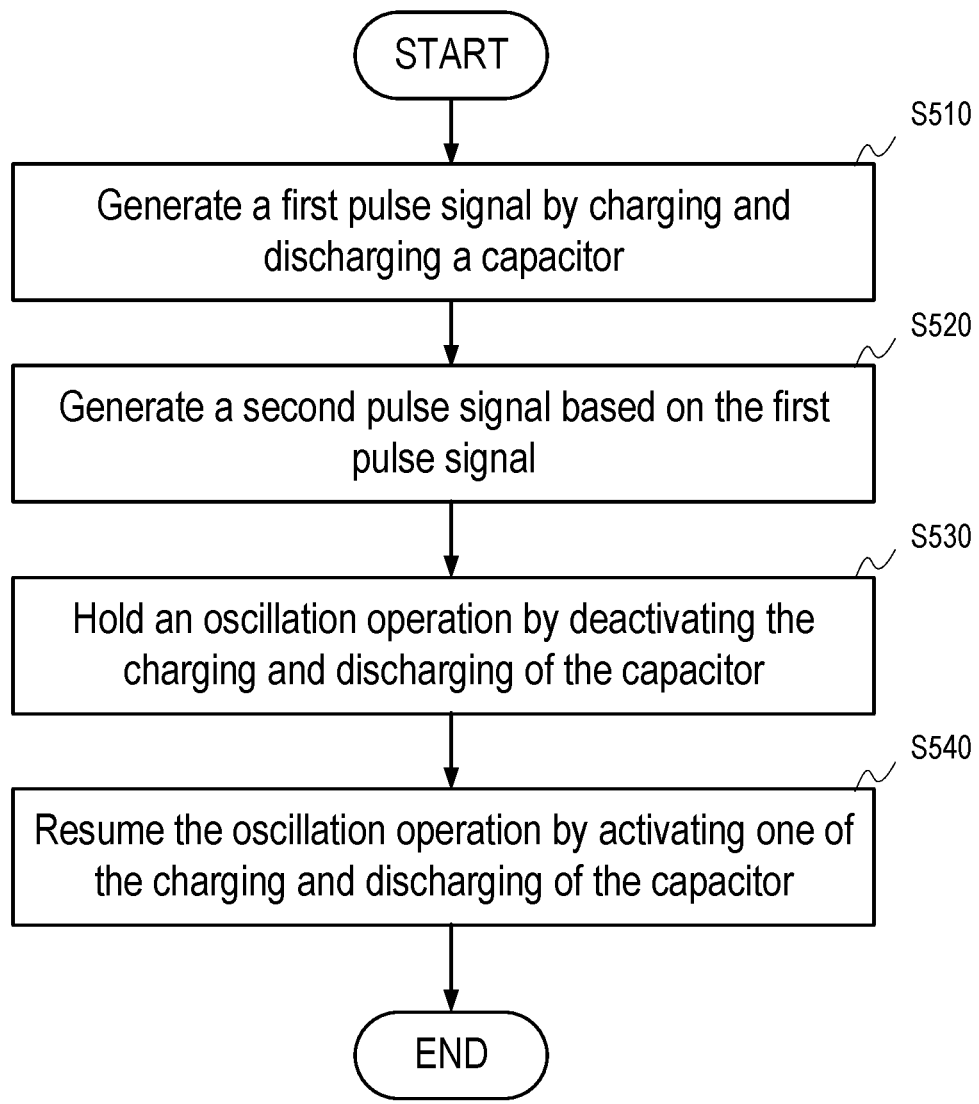
FIG. 5 is a flowchart illustrating an operation of an oscillator according to an embodiment.

FIG. 5 is a flowchart illustrating an operation of an oscillator according to an embodiment. The oscillation holding method of FIG. 5 will be described with reference to FIG. 3.

At S510, the oscillator 300 generates the internal pulse signal $F_{OSC.I}$ (or the first pulse signal) having a first frequency by charging and discharging the capacitor $C_{OSC}$ in response to the first and second switch control signals SRC and SNK in order to perform an oscillation operation.

At S520, the oscillator 300 generates the output pulse signal $F_{OSC.F}$ (or the second pulse signal) having a second frequency based on the internal pulse signal $F_{OSC.I}$, the first frequency being N times higher than the second frequency, N cycles of the internal pulse signal $F_{OSC.I}$ corresponding to one cycle of the output pulse signal $F_{OSC.F}$, the N being a positive integer.

At S530, the oscillator 300 holds the oscillation operation by generating the first and second switch control signals SRC and SNK in order to deactivate the charging and discharging of the capacitor $C_{OSC}$ of the oscillator 300 when the BCM end detection signal $S_{BCM.END}$ and the (N−j)th pulse detection signal $F_{OSC.H}$, the (N−j)th pulse detection signal being generated by detecting an (N−j)th cycle of the internal pulse signal $F_{OSC\_I}$ among the N cycles of the internal pulse signal $F_{OSC\_I}$.

At S540, the oscillator 300 resumes the oscillation operation by generating the first and second switch control signals SRC and SNK for activating one of the charging and discharging operations of the capacitor $C_{OSC}$ when the BCM end detection signal $S_{BCM\_END}$ is disabled.

Figure 6:
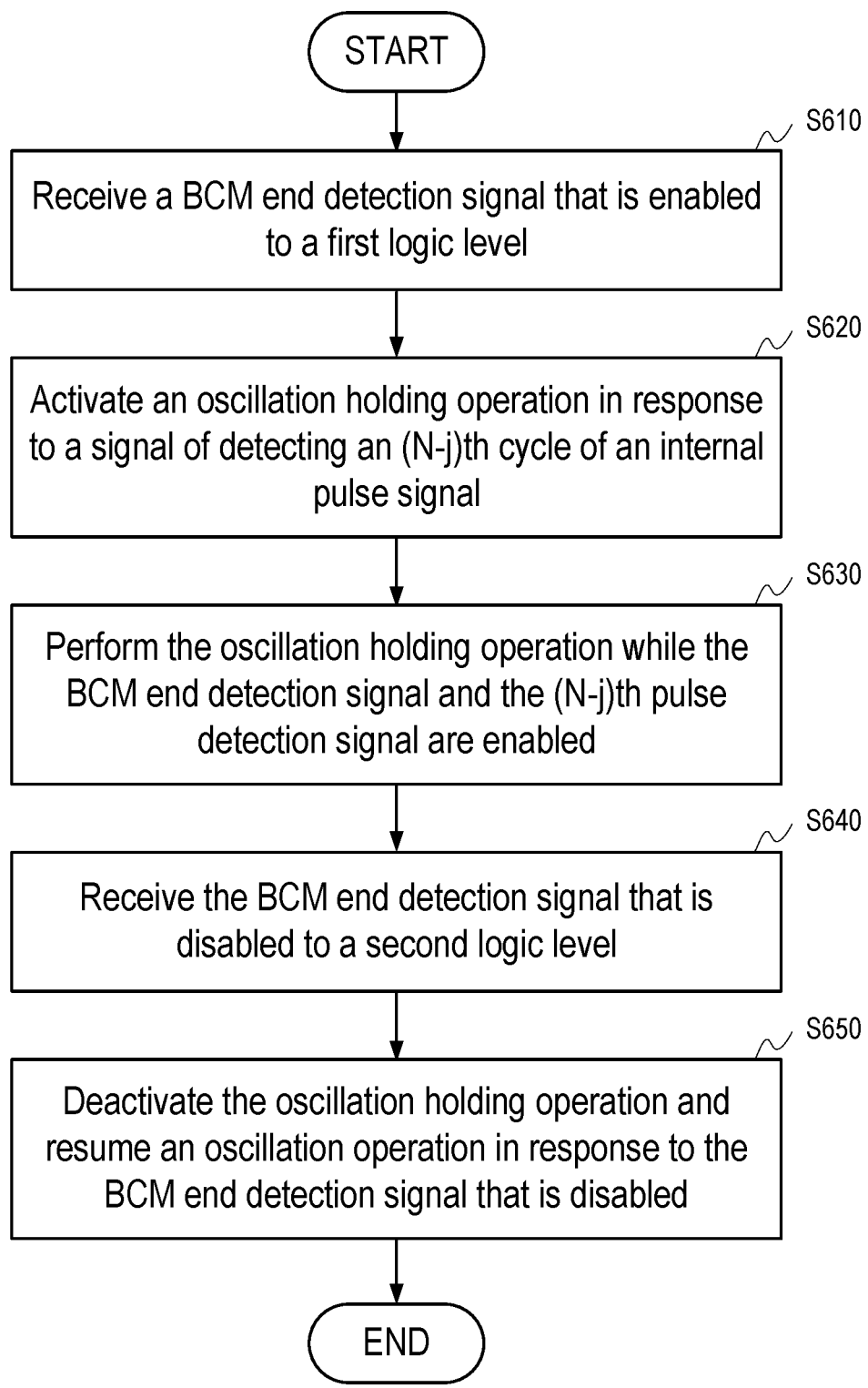
FIG. 6 is a flowchart illustrating an oscillation holding method according to an embodiment.

FIG. 6 is a flowchart illustrating an oscillation holding method according to an embodiment. The oscillation holding method of FIG. 6 will be described with reference to FIG. 3.

At S610, the oscillator 300 receives the BCM end detection signal $S_{BCM\_END}$ that is enabled to a first logic level, e.g., a high level.

At S620, the oscillator 300 activates an oscillation holding operation in response to the (N−j)th pulse detection signal $F_{OSC\_H}$ that is generated to have the first logic level by the 1/N frequency divider 350. The (N−j)th pulse detection signal $F_{OSC\_H}$ is generated by detecting an (N−j)th cycle of the internal pulse signal $F_{OSC\_I}$ output from the RS flip-flop 340 after the output pulse signal $F_{OSC\_F}$ changes to a high level.

At S630, the oscillator 300 performs the oscillation holding operation while the BCM end detection signal $S_{BCM\_END}$ maintains the first logic level after the (N−j)th pulse detection signal $F_{OSC\_H}$ is generated to have the first logic signal. During the oscillation holding operation in which both of the BCM end detection signal $S_{BCM\_END}$ and the (N−j)th pulse detection signal $F_{OSC\_H}$ are enabled to the first logic level, the oscillator 300 generates the first and second switch control signals SRC and SNK to deactivate both of the charging and discharging operations of the capacitor $C_{OSC}$, such that the internal pulse signal $F_{OSC\_I}$ and the output pulse signal $F_{OSC\_F}$ are maintain their previous logic levels without oscillating.

As S640, the oscillator 300 receives the BCM end detection signal $S_{BCM\_END}$ that is disabled to a second logic level, e.g., a low level.

At S650, the oscillator 300 deactivates the oscillation holding operation and resumes an oscillation operation in response to the BCM end detection signal $S_{BCM\_END}$ that is disabled, and thus the internal pulse signal $F_{OSC\_I}$ and the output pulse signal $F_{OSC\_F}$ normally oscillate. In particular, when the oscillation holding operation is deactivated, one of the first and second switch control signals SRC and SNK is enabled depending on the previous logic level of the internal pulse signal $F_{OSC\_I}$, and thus the oscillation operation is resumed.

The oscillator 300 performs the above oscillation holding operation of FIG. 5 when the (N−j)th pulse detection signal $F_{OSC\_H}$ is generated while the BCM end detection signal $S_{BCM\_END}$ is enabled, to thereby prevent the PWM controller from entering the CCM.

Embodiments of the present disclosure include electronic devices, e.g., one or more packaged semiconductor devices, configured to perform one or more of the operations described herein. However, embodiments are not limited thereto.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined.

What is claimed is:

1. An oscillator for a pulse width modulation (PWM) controller, comprising:
   an oscillation circuit including a capacitor and configured to generate a first pulse signal by charging and discharging the capacitor;
   a frequency divider configured to generate a second pulse signal based on the first pulse signal, the second pulse signal having a lower frequency than the first pulse signal; and
   an oscillation control circuit coupled to the oscillation circuit and the frequency divider and configured to generate control signals for holding the charging and discharging of the capacitor during an oscillation holding operation,
   wherein the PWM controller utilizes a boundary conduction mode (BCM) control algorithm, and
   wherein the oscillation control circuit generates the control signals based on the first pulse signal, a BCM end detection signal, and a pulse detection signal.

2. The oscillator of claim 1, wherein the BCM end detection signal is enabled when an output voltage of a device including the PWM controller is turned on and disabled when a storage energy of a load coupled to the device is zero.

3. The oscillator of claim 1, wherein the oscillation holding operation is activated when the BCM end detection signal and the pulse detection signal are enabled, and deactivated when the BCM end detection signal is disabled,
   wherein the frequency divider generates the pulse detection signal by detecting an (N−j)th cycle of the first pulse signal among N cycles of the first pulse signal that correspond to one cycle of the second pulse signal, and
   wherein N and j are positive integers, the N being greater than j.

4. The oscillator of claim 1, wherein the oscillation control circuit comprises:
   a state machine that receives the BCM end detection signal, the pulse detection signal, and the first pulse signal, as input signals, and generates the control signals and an intermediate pulse signal based on the input signals, the intermediate pulse signal corresponding to the first pulse signal and being input to the frequency divider.

5. The oscillator of claim 1, wherein the oscillation holding operation is activated when the BCM end detection signal and the pulse detection signal are enabled, and deactivated when the BCM end detection signal is disabled,
   wherein the frequency divider generates the pulse detection signal by detecting an (N−j)th cycle of the first pulse signal among N cycles of the first pulse signal that correspond to one cycle of the second pulse signal,
   wherein N and j are positive integers, the N being greater than j, and
   wherein the pulse detection signal is enabled at a rising edge or a falling edge of the (N−j)th cycle of the first pulse signal.

6. The oscillator of claim 1, wherein the oscillation circuit comprises:
   a triangular pulse generating circuit configured to perform a charging or discharging operation of the capacitor in response to the control signals from the oscillation control circuit, and generate a triangular pulse signal;

a first comparator configured to receive the triangular pulse signal at a positive input terminal, and receive a first reference voltage at a negative input terminal;

a second comparator configured to receive a second reference voltage at a positive input terminal, and receive the triangular pulse signal at a negative input terminal; and a RS flip-flop configured to receive an output signal of the first comparator at a set input terminal, receive an output signal of the second comparator at a reset input terminal, and output the first pulse signal, wherein the first reference voltage and the second reference voltage determine a swing width of the triangular pulse signal.

7. The oscillator of claim 6, wherein the triangular pulse generating circuit comprises:

the capacitor;

a first switch coupled to the capacitor and configured to charge the capacitor with a sourcing current in response to a first one of the control signals; and a second switch coupled to capacitor and configured to discharge the capacitor with a sinking current in response to a second one of the control signals, wherein the oscillation control circuit generates the first and second control signals to turn off the first and second switches during the oscillation holding operation.

8. The oscillator of claim 1, wherein the frequency of the second pulse signal is within a target frequency range of the oscillator, wherein the oscillation holding operation is activated when the BCM end detection signal and the pulse detection signal are enabled, and deactivated when the BCM end detection signal is disabled, wherein the frequency divider generates the pulse detection signal by detecting an (N−j)th cycle of the first pulse signal among N cycles of the first pulse signal that correspond to one cycle of the second pulse signal, wherein N and j are positive integers, the N being greater than j, and wherein the N is determined by a minimum frequency in the target frequency range.

9. The oscillator of claim 8, wherein the j increases as the N increases.

10. The oscillator of claim 9, wherein the N is within a range of 8 to 20.

11. A method of operating an oscillator for a pulse width modulation (PWM) controller, the method comprising:

generating a first pulse signal by charging and discharging a capacitor in response to control signals in order to perform an oscillation operation;

generating a second pulse signal based on the first pulse signal, the second pulse signal having a lower frequency than the first pulse signal;

holding the oscillation operation by generating the control signals in order to deactivate the charging and discharging of the capacitor of the oscillator; and resuming the oscillation operation by generating the control signals for activating one of the charging and discharging operations of the capacitor wherein the PWM controller utilizes a boundary conduction mode (BCM) control algorithm, and wherein the control signals are generated based on the first pulse signal, a BCM end detection signal, and a pulse detection signal.

12. The method of claim 11, wherein the BCM end detection signal is enabled when an output voltage of a device including the PWM controller is turned on and disabled when a storage energy of a load coupled to the device is zero.

13. The method of claim 12, wherein the oscillation operation is held when the BCM end detection signal and the pulse detection signal are enabled, and wherein the oscillation operation is resumed when the BCM end detection signal is disabled, wherein the pulse detection signal is generated by a frequency divider of the oscillator by detecting an (N−j)th cycle of the first pulse signal among N cycles of the first pulse signal that correspond to one cycle of the second pulse signal, and wherein N and j are positive integers, the N being greater than j.

14. A pulse width modulation (PWM) controller that utilizes a boundary conduction mode (BCM) control algorithm, comprising:

a logic part configured to generate a BCM end detection signal; and an oscillator configured to perform an oscillation operation to generate a first pulse signal having a first frequency, perform a 1/N frequency dividing operation based on the first pulse signal to generate a second pulse signal having a second frequency that varies in a target frequency range of the oscillator, and perform an oscillation holding operation for holding the oscillation operation based on the BCM end detection signal and an (N−j)th pulse detection signal, j being a positive integer smaller than N, wherein the first frequency is N times higher than the second frequency, and wherein the oscillator generates the (N−j)th pulse detection signal by detecting an (N−j)th cycle of the first pulse signal among N cycles of the first pulse signal that correspond to one cycle of the second pulse signal.

15. The PWM controller of claim 14, wherein the BCM end detection signal is enabled when an output voltage of a device including the PWM controller is turned on and disabled when a storage energy of a load coupled to the device is zero.

16. The PWM controller of claim 14, wherein the oscillation holding operation is activated when both of the BCM end detection signal and the (N−j)th pulse detection signal are enabled, and deactivated when the BCM end detection signal is disabled.

17. The PWM controller of claim 14, wherein the oscillator comprises:

an oscillation circuit including a capacitor and configured to generate the first pulse signal by charging and discharging the capacitor using a sourcing current and a sinking current, the first frequency of the first pulse signal corresponding to a charging or discharging speed of the capacitor;

a 1/N frequency divider configured to perform the 1/N frequency dividing operation to generate the second pulse signal; and an oscillation control circuit coupled between the oscillation circuit and the 1/N frequency divider and configured to control the oscillation operation and the oscillation holding operation by controlling the charging and discharging operations of the capacitor based on the first pulse signal, the BCM end detection signal, and the (N−j)th pulse detection signal, wherein the 1/N frequency divider further generates the (N−j)th pulse detection signal.

18. The PWM controller of claim 17, wherein the oscillation control circuit comprises:
- a state machine that receives the BCM end detection signal, the (N−j)th pulse detection signal, and the first pulse signal, as input signals, and generates the control signals and an intermediate pulse signal based on the input signals, the intermediate pulse signal corresponding to the first pulse signal and being input to the 1/N frequency divider.

19. The PWM controller of claim 17, wherein the oscillation control circuit comprises:
- a NAND gate receiving the BCM end detection signal and the (N−j)th pulse detection signal;
- an AND gate receiving the first pulse signal and an output signal of the NAND gate, and generating a second one of the control signals; and
- an OR gate receiving the first pulse signal and an inverted signal of the output signal of the NAND gate and generating a first one of the control signals,
- wherein the first control signal corresponds to an intermediate pulse signal that is input to the 1/N frequency divider.

* * * * *